(12) United States Patent
Kim et al.

(10) Patent No.: US 9,093,415 B2
(45) Date of Patent: Jul. 28, 2015

(54) INTEGRATED CIRCUIT PACKAGING SYSTEM WITH HEAT SPREADER AND METHOD OF MANUFACTURE THEREOF

(71) Applicants: Oh Han Kim, Icheon-si (KR); Sell Jung, Seoul (KR); HeeSoo Lee, Anyang-si (KR); Jae Han Chung, Yongin-si (KR); YoungChul Kim, Youngin-si (KR)

(72) Inventors: Oh Han Kim, Icheon-si (KR); Sell Jung, Seoul (KR); HeeSoo Lee, Anyang-si (KR); Jae Han Chung, Yongin-si (KR); YoungChul Kim, Youngin-si (KR)

(73) Assignee: STATS ChipPAC Ltd., Singapore (SG)

( * ) Notice: Subject to any disclaimer, the term of this patent is extended or adjusted under 35 U.S.C. 154(b) by 0 days.

(21) Appl. No.: 14/037,110

(22) Filed: Sep. 25, 2013

(65) Prior Publication Data
US 2015/0084178 A1 Mar. 26, 2015

(51) Int. Cl.
*H01L 23/36* (2006.01)
*H01L 25/065* (2006.01)

(52) U.S. Cl.
CPC .............. *H01L 23/36* (2013.01); *H01L 25/065* (2013.01)

(58) Field of Classification Search
CPC ............................. H01L 23/36; H01L 25/065
USPC ......... 257/706, 707, 712, 713, 720, 722, 778, 257/737, 738, 704, 71, 708, 710; 438/122; 361/720; 29/846
See application file for complete search history.

(56) References Cited

U.S. PATENT DOCUMENTS

| | | | |
|---|---|---|---|
| 5,450,283 A | 9/1995 | Lin et al. | |
| 6,486,562 B1 | 11/2002 | Kato | |
| 6,906,413 B2 * | 6/2005 | Bish et al. | 257/706 |
| 7,153,725 B2 | 12/2006 | Wang et al. | |
| 7,361,972 B2 * | 4/2008 | Chen | 257/622 |
| 7,608,915 B2 | 10/2009 | Liao et al. | |
| 8,198,131 B2 | 6/2012 | Weng et al. | |
| 8,314,486 B2 | 11/2012 | Chi et al. | |
| 8,786,076 B2 * | 7/2014 | Kim et al. | 257/707 |
| 2011/0215448 A1 | 9/2011 | Cho et al. | |
| 2012/0146177 A1 * | 6/2012 | Choi et al. | 257/528 |
| 2013/0049188 A1 | 2/2013 | Choi et al. | |
| 2013/0105829 A1 * | 5/2013 | Bisberg | 257/88 |
| 2013/0341784 A1 * | 12/2013 | Lin et al. | 257/737 |

OTHER PUBLICATIONS

U.S. Appl. No. 13/489,282, filed Jun. 5, 2012, Kim et al.

* cited by examiner

*Primary Examiner* — Alexander Oscar Williams
(74) *Attorney, Agent, or Firm* — Ishimaru & Associates LLP

(57) ABSTRACT

An integrated circuit packaging system, and method of manufacture therefor, includes: a substrate; a mold cap formed on the substrate; fiducial mark inscribed in the mold cap; a thermal interface material applied over the substrate and referenced by the fiducial mark; and a heat spreader, mounted on the thermal interface material, precisely positioned by a position notch aligned relative to the fiducial mark.

20 Claims, 5 Drawing Sheets

INTEGRATED CIRCUIT PACKAGING SYSTEM WITH HEAT SPREADER AND METHOD OF MANUFACTURE THEREOF

TECHNICAL FIELD

The present invention relates generally to an integrated circuit packaging system, and more particularly to a system for packaging high performance integrated circuits.

BACKGROUND ART

Many of today's consumer electronics are packing more function in less space. This is evidenced by the emergence of cell phone camcorders, wrist watch cell phones with integrated cameras, cell phone sized tablet computers, and personal music players slightly larger than a coin.

The challenges to integrated circuit manufacturers is one of scaling transistors to a size that will allow integration of the millions of transistors required to implement these functions and provide enough interface contacts to allow the functions to work properly. Quite often the amount of functions that are integrated will be limited by the number of interface interconnects that can be provided in a given space. Advances in the development of interface density has pushed the number of interconnects from 40 pin integrated circuits to 400-1000 pin flip chip integrated circuits.

With the dramatic increase in input/output (I/O) pin count, a new limiter has come on the scene. Removing the heat generated by the switching of millions of transistors can be a daunting task. Integrated circuits having limited functions and tens of I/O pins could rely on the heat being transmitted through I/O interconnects themselves. The heat would flow from the integrated circuit chip through the packaging interconnects to a system board that had sufficient mass to dissipate the thermal energy.

In today's integrated circuit packages, the number of transistors that can expel heat through the I/O interconnects is limited due to the thermal resistance of the path and the sheer number of transistors generating the heat. Since excessive heat has a major impact on the reliability of an integrated circuit, solutions to this problem is of utmost importance.

Thus, a need still remains for an integrated circuit packaging system with heat spreader for improving the reliability of ever shrinking packages. In view of the advances in the number of transistors that can be integrated in a single package and the amount of heat a package must be able to dissipate, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a substrate; forming a mold cap, on the substrate; inscribing fiducial marks in the mold cap; positioning a thermal interface material, applied over the substrate, referenced by the fiducial marks; and mounting a heat spreader, on the thermal interface material, precisely positioned by aligning a position notch relative to the fiducial marks.

The present invention provides an integrated circuit packaging system, including: a substrate; a mold cap formed on the substrate; fiducial marks inscribed in the mold cap; a thermal interface material applied over the substrate and referenced by the fiducial marks; and a heat spreader, mounted on the thermal interface material, precisely positioned by a position notch aligned relative to the fiducial marks.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
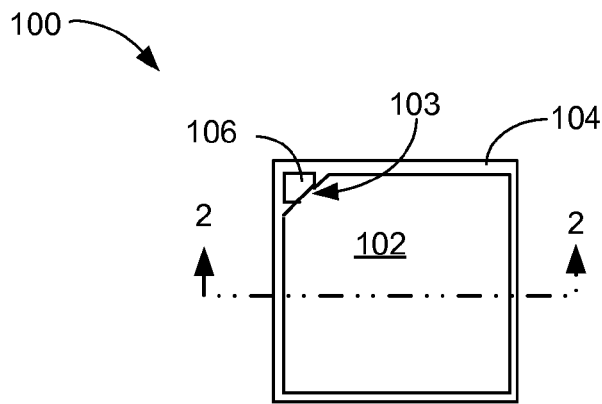
FIG. 1 is a top view of an integrated circuit packaging system with heat spreader in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another, will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the active side of the integrated circuit die, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between elements with no intervening materials.

The term "processing" as used herein includes deposition of material or photoresist, patterning, exposure, development, etching, cleaning, and/or removal of the material or photoresist as required in forming a described structure.

Referring now to FIG. 1, therein is shown a top view of an integrated circuit packaging system 100 with heat spreader in an embodiment of the present invention. The cross-sectional view of the integrated circuit packaging system 100 depicts a heat spreader 102 having a position notch 103 precisely positioned on a mold cap 104 having a fiducial mark 106. The mold cap 104 can be formed of an epoxy molding compound or ceramic molding compound for providing protection to an integrated circuit die (not shown).

The heat spreader 102 can be precisely positioned on the mold cap 104 by an optical positioning system (not shown). The optical positioning system can use the fiducial mark 106 as a contrast point on the mold cap 104 in order to position the position notch 103 of the heat spreader 102 within a range of plus or minus 25 micro-meters on the mold cap 104.

It has been discovered that by forming the fiducial mark 106 on the mold cap 104, the optical positioning system can provide precise placement of the position notch 103 on the heat spreader 102. The position of the heat spreader 102 cannot be held to the precise positioning range without the fiducial mark 106 and the position notch 103 because the edge of the mold cap 104 does not allow sufficient contrast to provide a reference for the optical positioning system.

A section line 2-2 can provide the cross-sectional view of FIG. 2, which is further described below.

Figure 2:
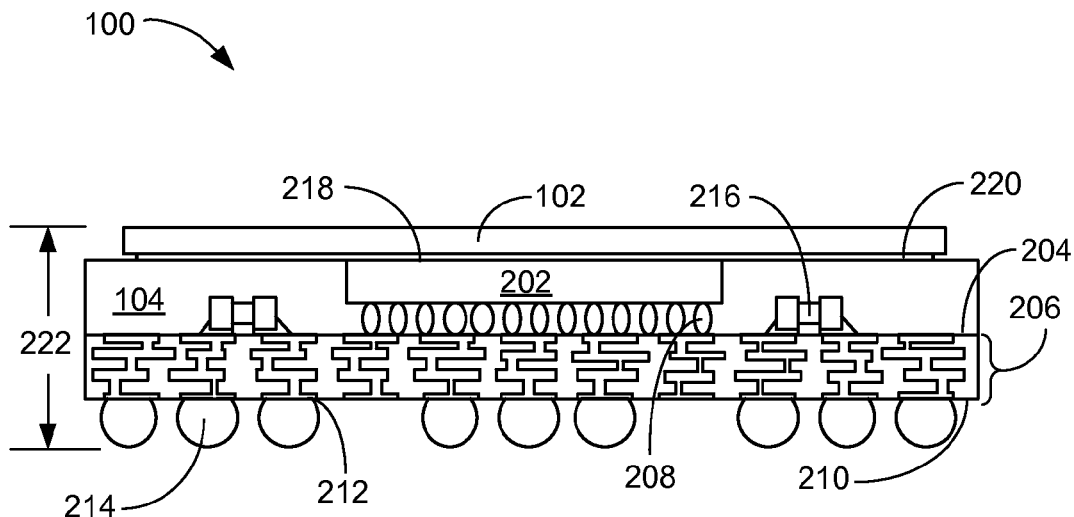
FIG. 2 is a cross-sectional view of the integrated circuit packaging system with the heat spreader, as viewed along section line 2-2 of FIG. 1.

Referring now to FIG. 2, therein is shown a cross-sectional view of the integrated circuit packaging system 100 with the heat spreader 102, as viewed along section line 2-2 of FIG. 1. The cross-sectional view of the integrated circuit packaging system 100 depicts a flip chip integrated circuit 202 coupled to a component side 204, of a package substrate 206, by chip interconnects 208, such as solder bumps, stud bumps, solder columns, gold bumps, or the like. The flip chip integrated circuit 202 can be an ultra-thin flip chip for minimizing the thickness of the integrated circuit packaging system 100.

A system side 210, of the package substrate 206, can provide signal coupling paths 212. The signal coupling paths 212 can have system interconnects 214, such as solder balls, solder columns, gold bumps, or the like, for attachment to the next level system (not shown). The signal coupling paths 212 can provide a signal connection to the flip chip integrated circuit 202 or to a discrete component 216. The discrete component 216 can include a resistor, capacitor, inductor, diode, transistor, or the like. The term discrete as used herein means a singly packaged component.

The mold cap 104 can be formed, on the component side 204, to enclose the chip interconnects 208, the discrete components 216, and to be coplanar with a flip chip back-side 218 of the flip chip integrated circuit 202. The flip chip back-side 218 can be exposed from the mold cap 104 for applying a thermal interface material 220, such as a thermal adhesive between the flip chip back-side 218 and the heat spreader 102. Due to the compact nature of the integrated circuit packaging system 100, a package height 222 can be in the range of 1.2 mm to 1.3 mm.

It has been discovered that the application of the heat spreader 102 over the top of the mold cap 104 and the flip chip back-side 218, coupled by the thermal interface material 220, can reduce warpage due to temperature and improve co-planarity of the system interconnects 214. The reduced size of the package height 222 can be less than half the thickness of prior art packages having a thermal relief mechanism, such as the heat spreader 102. It has further been discovered that the attachment of the heat spreader 102, by the thermal interface material 220, to the flip chip back-side 218 can provide less thermal resistance to the heat spreader 102 than through the combination of the chip interconnects 208, the signal coupling paths 212, and the system interconnects 214. The reduced thermal resistance between the flip chip back-side 218 and the heat spreader 102 can improve the reliability of the integrated circuit packaging system 100 by allowing a lower operating temperature of the flip chip integrated circuit 202.

It is understood that the discrete components 216 can surround the flip chip integrated circuit 202, as long as sufficient connection to the signal coupling paths 212 can be provided. The number and position of the discrete components 216 is an example only and any number of the discrete components 216 can be included. It is further understood that the number and position of the system interconnects 214 is an example only and the number of the system interconnects 214 is only limited by the minimum interconnect spacing of the next level system (not shown).

Figure 3:
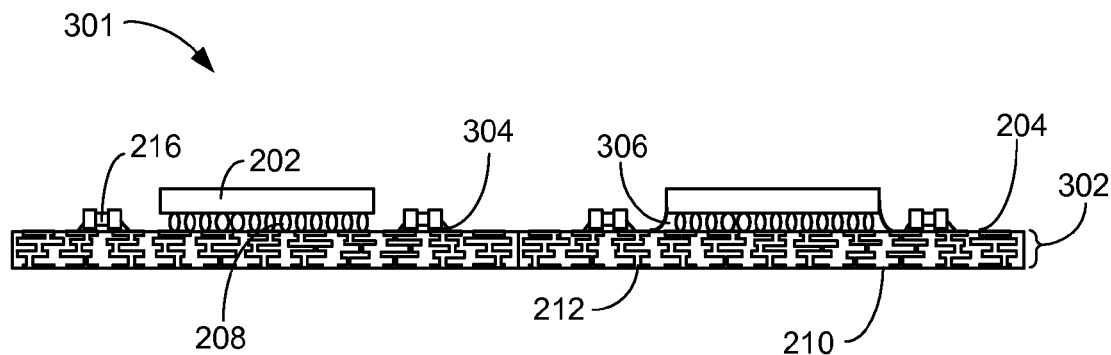
FIG. 3 is a cross-sectional view of a substrate panel assembly in a component assembly phase of manufacturing.

Referring now to FIG. 3, therein is shown a cross-sectional view of a substrate panel assembly 301 in a component assembly phase of manufacturing. The cross-sectional view of the substrate panel assembly 301 depicts a substrate 302 having the component side 204 and the system side 210. The signal coupling paths 212 can connect the system side 210 to the component side 204.

The flip chip integrated circuit 202 can be coupled to the signal coupling paths 212 on the component side 204 by the chip interconnects 208. The discrete components 216 can be coupled to the signal coupling paths 212 on the component side 204 by a conductive adhesive, such as solder paste that is reflowed to form connective solder 304.

By way of an example, there is an optional application of an underfill adhesive 306 surrounding the chip interconnects 208 and between the flip chip integrated circuit 202 and the component side 204. The application of the underfill adhesive 306 can add to the stiffness of the substrate 302 and can assist in preventing damage to the chip interconnects 208 during the additional manufacturing processes. Only one of the flip chip integrated circuit 202 is shown having the underfill adhesive 306, but it is understood that if the underfill adhesive 306 is used it would be present on each of the flip chip integrated circuit 202.

Figure 4:
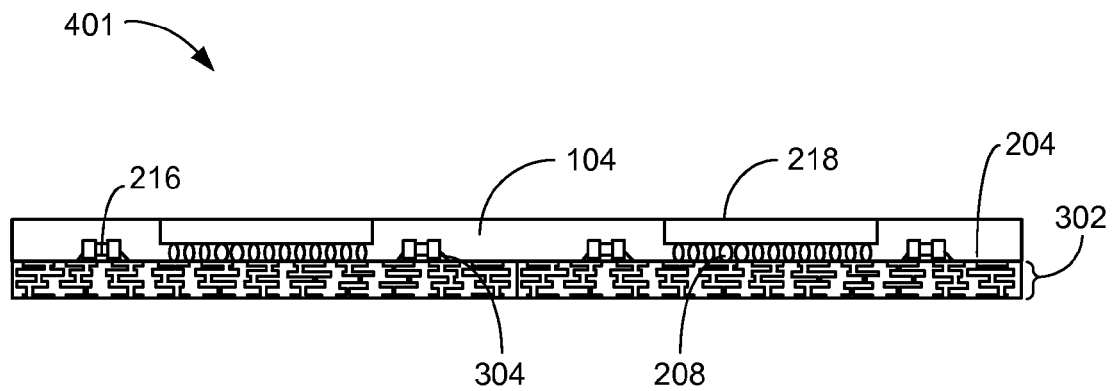
FIG. 4 is a cross-sectional view of a substrate panel assembly in a molding phase of manufacturing.

Referring now to FIG. 4, therein is shown a cross-sectional view of a substrate panel assembly 401 in a molding phase of manufacturing. The cross-sectional view of the substrate panel assembly 401 depicts the substrate 302 having the component side 204 completely covered by the mold cap 104.

The mold cap 104 can add to the rigidity of the substrate panel assembly 401 to help prevent warpage that can add stress to the chip interconnects 208 and the connective solder 304. The mold cap 104 can completely surround and support the chip interconnects 208 and the discrete components 216. The top level of the mold cap 104 is formed to be coplanar with the flip chip back-side 218.

Figure 5:
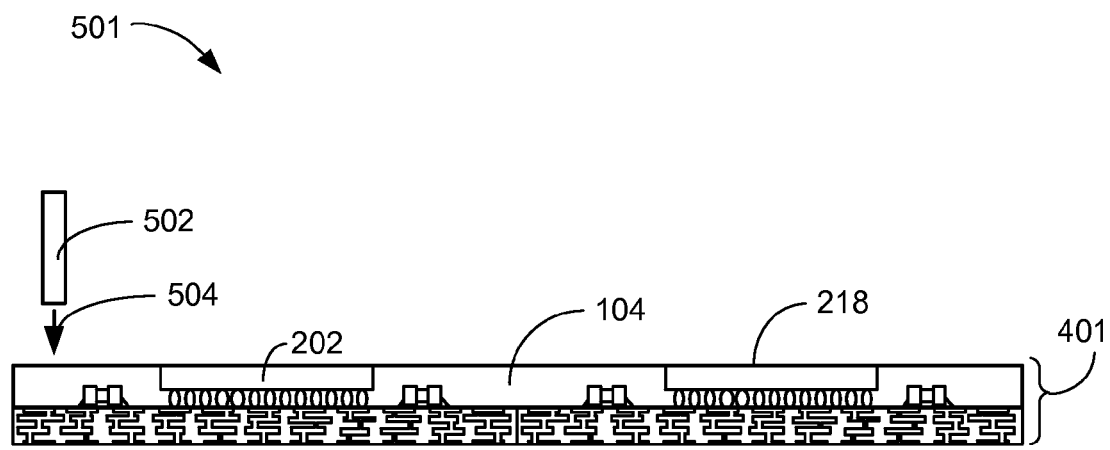
FIG. 5 is a cross-sectional view of the substrate panel assembly of FIG. 4 in a laser marking phase of manufacturing.

Referring now to FIG. 5, therein is shown a cross-sectional view of the substrate panel assembly 401 of FIG. 4 in a laser marking phase 501 of manufacturing. The cross-sectional view of the substrate panel assembly 401 can be processed by a laser marking device 502. The laser marking device 502 can be precisely positioned above the plane of the flip chip back-side 218.

The horizontal position on the plane of the flip chip back-side 218 can be precisely inscribed by laser energy 504 in order to provide the fiducial mark 106 of FIG. 1 around the flip chip integrated circuit 202 and on the surface of the mold cap 104. The fiducial mark 106 can be replicated in three places on the mold cap 104 of FIG. 1 and each positioned within a tolerance of plus or minus 25 μm of the intended location.

Figure 6:
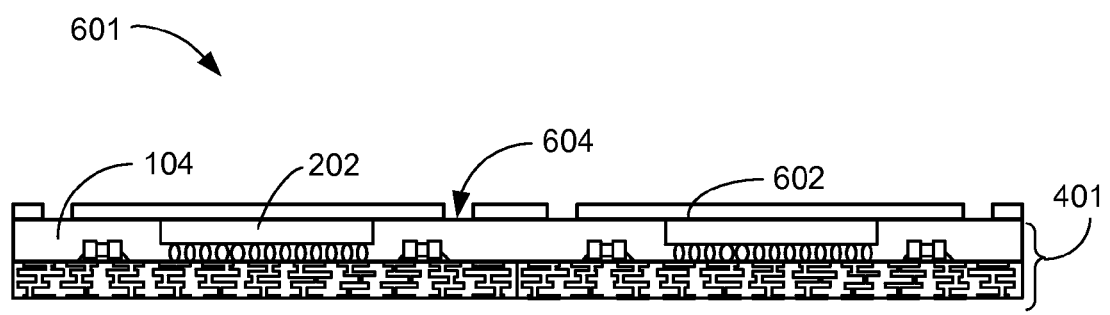
FIG. 6 is a cross-sectional view of the substrate panel assembly of FIG. 4 in an etching phase of manufacturing.

Referring now to FIG. 6, therein is shown a cross-sectional view of the substrate panel assembly 401 of FIG. 4 in an etching phase 601 of manufacturing. The cross-sectional view of the substrate panel assembly 401 depicts a mask 602 deposited on the surface of the mold cap 104 and the flip chip integrated circuit 202. The mask 602 can have patterned openings 604 precisely positioned around the periphery of the flip chip integrated circuit 202.

The patterned openings 604 can be precisely positioned through a photo-resist process to a tolerance of plus or minus 0.1 μm. Once the patterned openings 604 are precisely positioned, the surface of the mold cap 104 can be inscribed by an etching process to provide the fiducial mark 106. After the etch has inscribed the fiducial mark 106, the mask 602 can be removed.

Figure 7:
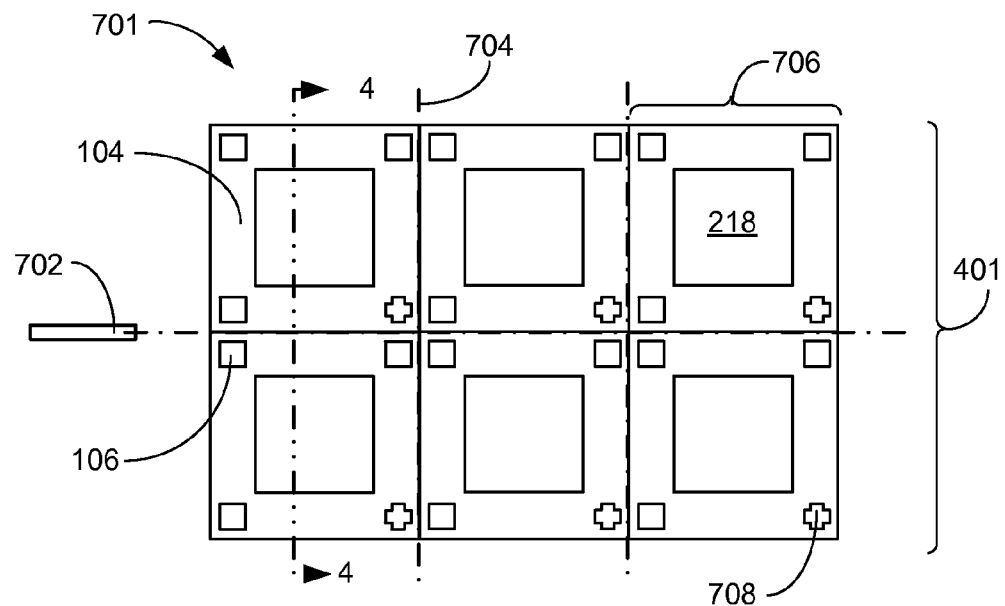
FIG. 7 is a top view of the substrate panel assembly of FIG. 4 in a singulation phase of manufacturing.

Referring now to FIG. 7, therein is shown a top view of the substrate panel assembly 401 of FIG. 4 in a singulation phase 701 of manufacturing. The top view of the substrate panel assembly 401 depicts a singulation device 702, such as a singulation saw, shear, or laser cutter. The singulation device 702 can follow the singulation lines 704 for separating a base package 706.

The base package 706 can have the flip chip back-side 218 exposed from and coplanar with the mold cap 104. The mold cap 104 can have a fiducial mark 106 precisely positioned in the corners of the base package 706. A reading mark 708 can be precisely positioned in one of the corners of the mold cap 104. The reading mark 708 can be used to designate a package orientation or special feature.

It is understood that the shape of the fiducial mark 106 can be any shape, such as a circle, an oval, a diamond, a square, a rectangle, a cross, a triangle, or the like recessed into the surface of the mold cap 104. The reading mark 708 can be any shape that is different from the fiducial mark 106.

A section line 4-4 shows the position and direction of view of the substrate panel assembly 401. The substrate panel assembly 401 is shown in an arrangement of 2 by 3 as an example only. The substrate panel assembly 401 can be implemented in any array configuration without limiting the invention. The position and type of the fiducial mark 106 and the reading mark 708 can be established based on the size of the heat spreader 102 of FIG. 1 and the size of the mold cap 104 as defined by the singulation lines 704.

It is understood that the precise positioning of the heat spreader 102 can extend the reliability of the integrated circuit packaging system 100 of FIG. 1 by removing the thermal energy from the flip chip integrated circuit 202 of FIG. 2. It has been discovered that the package height 222 of FIG. 2 can be minimized while improving the reliability of the integrated circuit packaging system 100.

Figure 8:
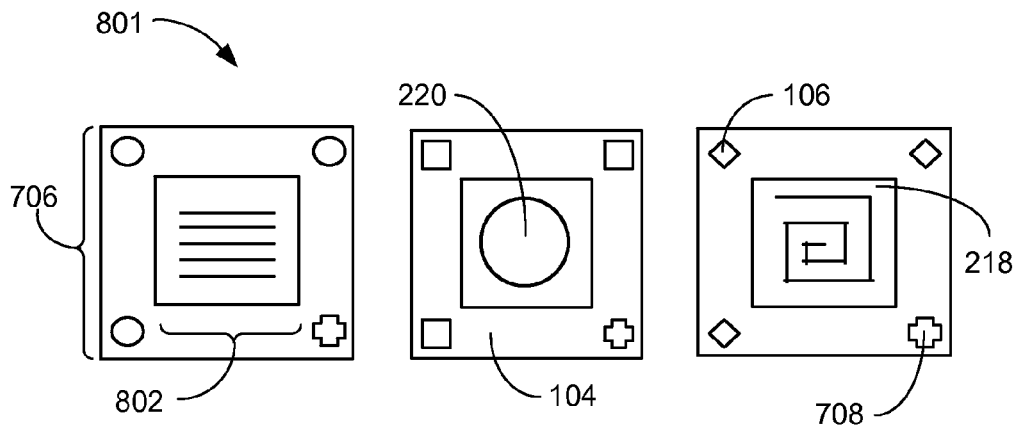
FIG. 8 is a top view of the base package of FIG. 7 in a thermal interface material application phase of manufacturing.

Referring now to FIG. 8, therein is shown a top view of the base package 706 of FIG. 7 in a thermal interface material application phase 801 of manufacturing. The top view of the base package 706 depicts the fiducial mark 106 and the reading mark 708 that are each formed as a recessed shape in the mold cap 104, which can be used as a position reference for applying the thermal interface material 220. The thermal interface material 220 can be applied in a measured pattern 802 having sufficient quantity and in a position to fill all of the space between the flip chip back-side 218 and the heat spreader 102 of FIG. 1 without leaving voids.

It is understood that the shape and position of the fiducial mark 106 and the reading mark 708 can vary and there is no limitation on the shape of the recess that can be used for these purposes. The position references provided by three of the fiducial mark 106 and the reading mark 708 can allow a precise positioning of the thermal interface material 220 on the flip chip back-side 218. The thermal interface material 220 can be applied in the measured pattern 802, such as parallel lines, a circular mass, a spiral, compound X patterns, or the like.

The amount of the thermal interface material 220 in the measured pattern 802 can be calculated to provide complete coverage of the flip chip back-side 218 without leaving any voids between the flip chip back-side 218 and the heat spreader 102. Some of the volume of the thermal interface material 220 can fill the space between the mold cap 104 and the heat spreader 102 without extending beyond the edge of the heat spreader 102.

Figure 9:
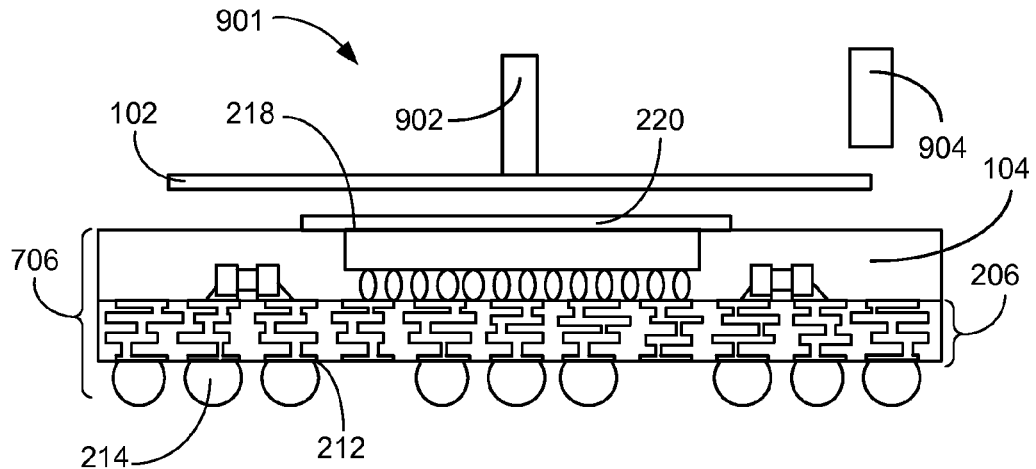
FIG. 9 is a cross-sectional view of the base package of FIG. 7 in a heat spreader installation phase of manufacturing.

Referring now to FIG. 9, therein is shown a cross-sectional view of the base package 706 of FIG. 7 in a heat spreader installation phase 901 of manufacturing. The cross-sectional view of the base package 706 depicts the thermal interface material 220 precisely positioned on the flip chip back-side 218. The heat spreader 102 can be picked-up by a component positioning device 902, such as a pick and place device. The component positioning device 902 can include an optical sensor 904 for detecting the alignment of the heat spreader 102 relative to the fiducial mark 106 of FIG. 1 and the reading mark 708 of FIG. 7.

It is understood that the thermal interface material 220, in the measured pattern 802, can be precisely positioned on the flip chip back-side 218 and the mold cap 104 based on the position reference provided by the fiducial mark 106 and the reading mark 708. The component positioning device 902 can precisely align and press the heat spreader 102 into position on the thermal interface material 220.

The system interconnects 214 can be coupled to the signal coupling paths 212 on the system side of the package substrate 206 prior to the singulation process. It is understood that the base package 706 can be electrically tested prior to the singulation process in order to continue the manufacturing on only the good tested units of the base package 706. The application of the thermal interface material 220 and the heat spreader 102 will only be applied to known good units of the base package 706.

It has been discovered that the application of the heat spreader 102 on the base package 706 can distribute the thermal interface material 220, which has been patterned to eliminate the possibility of voids between the flip chip back-side 218 and the heat spreader 102. The integrated circuit packaging system 100 can maintain the coplanarity of the system interconnects 214 and prevent high temperature warpage of the base package 706 while providing a package height 222 of FIG. 2 of less than or equal to 1.3 mm. Thus, it has been discovered that the integrated circuit packaging system 100 and device or product of the present invention furnishes important and heretofore unknown and unavailable solutions, capabilities, and functional aspects for manufacturing high thermal performance integrated circuit packages with less of the package height 222 of FIG. 2 than prior art processes.

Figure 10:
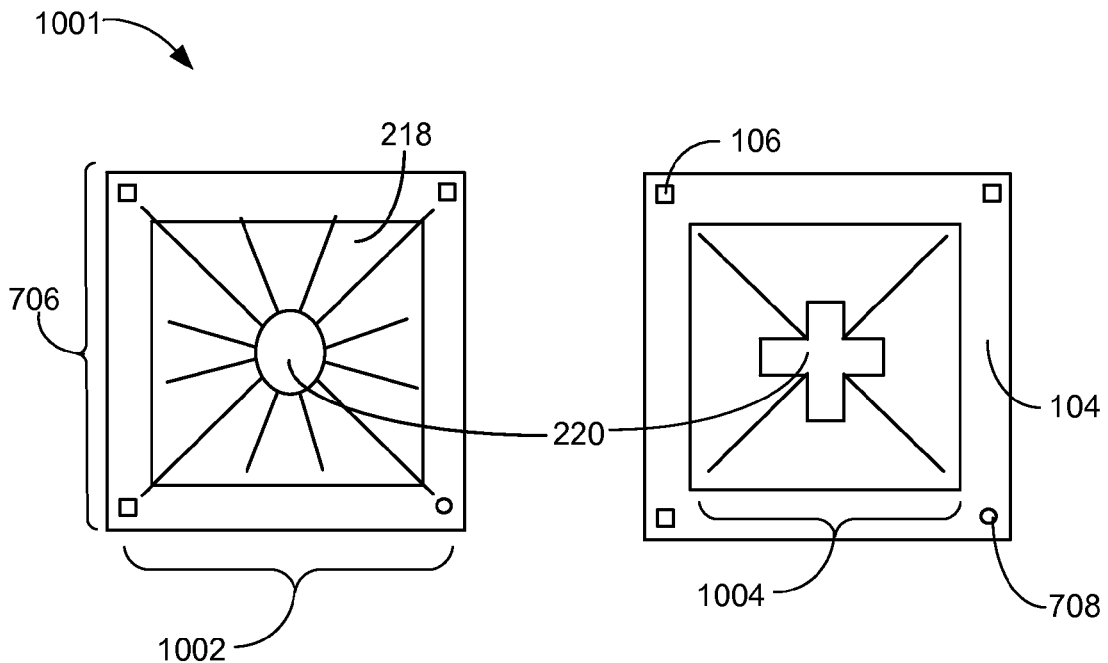
FIG. 10 is a top view of the base package in a thermal interface material pattern application phase of manufacturing.

Referring now to FIG. 10, therein is shown a top view of the base package 706 in a thermal interface material pattern application phase 1001 of manufacturing. The top view of the base package 706 depicts the fiducial mark 106 and the reading mark 708 that are each formed as a recessed shape in the mold cap 104, which can be used as a position reference for applying the thermal interface material 220. The thermal interface material 220 can be applied in a starburst pattern 1002 or an X-cross pattern 1004 having sufficient quantity and in a position to fill all of the space between the flip chip back-side 218 and the heat spreader 102 of FIG. 1 without leaving voids.

It is understood that the shape and position of the fiducial mark 106 and the reading mark 708 can vary and there is no limitation on the shape of the recess that can be used for these purposes. The position references provided by three of the fiducial mark 106 and the reading mark 708 can allow a precise positioning of the thermal interface material 220 on the flip chip back-side 218. The thermal interface material 220 can be applied in the starburst pattern 1002 or the X-cross pattern 1004.

The amount of the thermal interface material 220 in the measured pattern 802 can be calculated to provide complete coverage of the flip chip back-side 218 without leaving any voids between the flip chip back-side 218 and the heat spreader 102. Some of the volume of the thermal interface material 220 can fill the space between the mold cap 104 and the heat spreader 102 without extending beyond the edge of the heat spreader 102.

Figure 11:
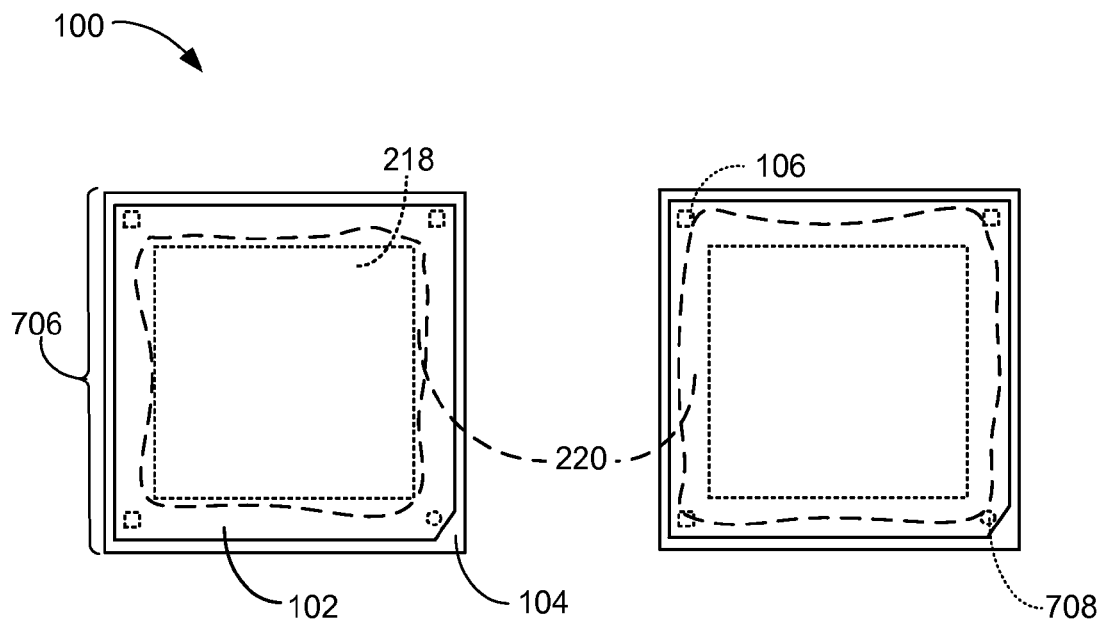
FIG. 11 is a top plan view of the integrated circuit packaging system with heat spreader.

FIG. 11 is a top plan view of the integrated circuit packaging system 100 with heat spreader 102. The top plan view of the integrated circuit packaging system 100 depicts the base package 706 having the fiducial mark 106 and the reading mark 708. The flip chip back-side 218 can be completely covered by the thermal interface material 220 without leaving any voids. By controlling the volume of the thermal interface material 220 and by applying the measured pattern 802 of FIG. 8, the starburst pattern 1002 of FIG. 10 or the X-cross pattern 1004 of FIG. 10, a precise percentage of the mold cap 104 can be covered by the thermal interface material 220.

By way of an example, for any of the measured pattern 802, the starburst pattern 1002, or the X-cross pattern 1004 and controlling the volume of the thermal interface material 220 by weight, can cover 60% of the mold cap 104 with 15 mg of the thermal interface material 220 or 80% of the mold cap 104 can be covered by using 20 mg of the thermal interface material 220. It is understood that the use of the measured pattern 802, the starburst pattern 1002, or the X-cross pattern 1004 can prevent the occurrence of voids between the heat spreader 102 and the flip chip back-side 218. The extension of the thermal interface material 220 onto a portion of the mold cap 104 can prevent delamination of the heat spreader 102.

Figure 12:
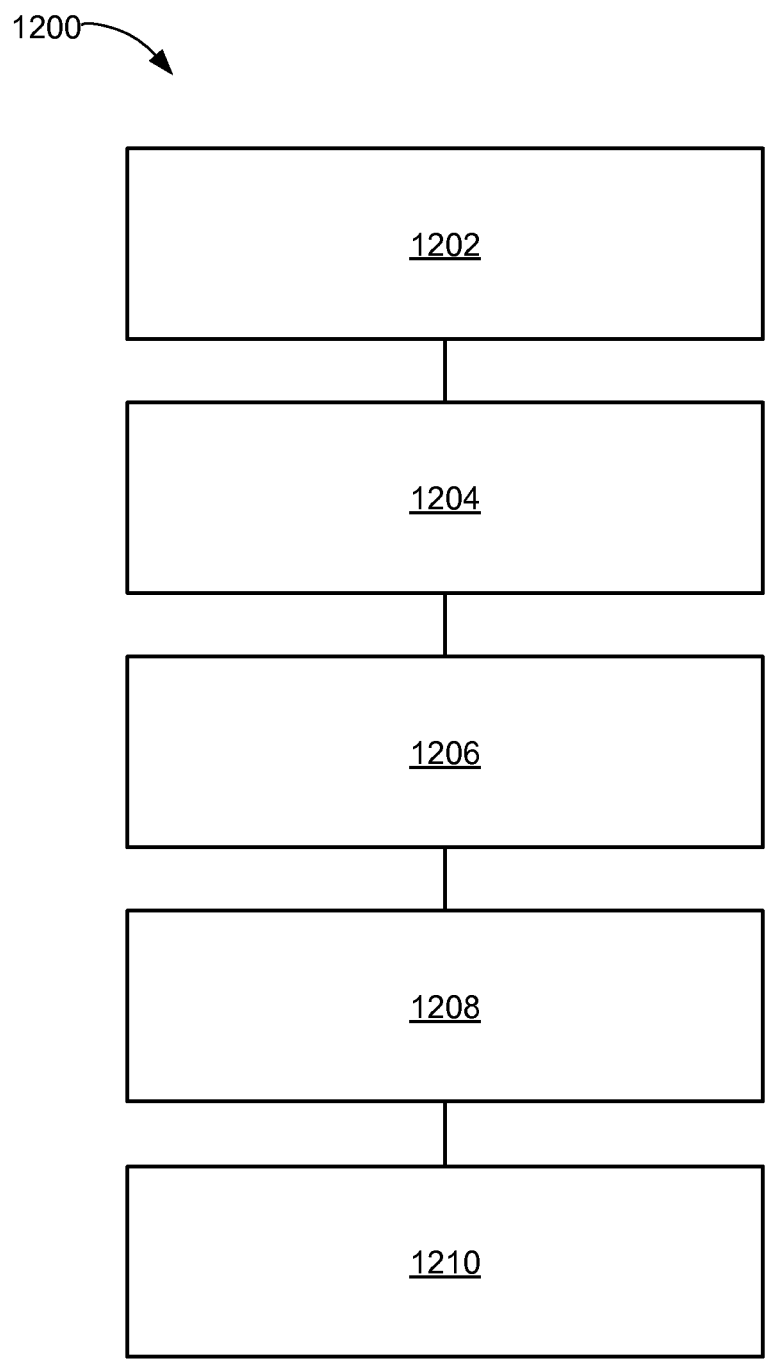
FIG. 12 is a flow chart of a method of manufacture of an integrated circuit packaging system in an embodiment of the present invention.

Referring now to FIG. 12, therein is shown a flow chart of a method 1200 of manufacture of an integrated circuit packaging system in an embodiment of the present invention. The method 1200 includes: providing a substrate in a block 1202; forming a mold cap, on the substrate in a block 1204; inscribing fiducial marks in the mold cap in a block 1206; positioning a thermal interface material, applied over the substrate, referenced by the fiducial marks in a block 1208; and mounting a heat spreader, on the thermal interface material, precisely positioned by aligning a position notch relative to the fiducial marks in a block 1210.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems, with low package height and good thermal performance, fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hitherto fore set forth herein or shown in the accompanying drawings are to be interpreted in an illustrative and non-limiting sense.

What is claimed is:

1. A method of manufacture of an integrated circuit packaging system comprising:
   providing a substrate;
   forming a mold cap, on the substrate;
   inscribing a fiducial mark in the mold cap;
   positioning a thermal interface material, applied over the substrate, referenced by the fiducial mark; and
   mounting a heat spreader, on the thermal interface material, precisely positioned by aligning a position notch relative to the fiducial mark, the heat spreader having a bottom surface above a top surface of the mold cap and a portion of thermal interface material exposed from the heat spreader and the mold cap.

2. The method as claimed in claim 1 further comprising mounting a flip chip integrated circuit, having a flip chip back-side, on the substrate; and
   wherein:
   forming the mold cap includes forming the mold cap, on the flip chip integrated circuit, to be coplanar with the flip chip back-side.

3. The method as claimed in claim 1 wherein positioning the thermal interface material referenced by the fiducial mark includes forming a measured pattern precisely positioned between three of the fiducial mark.

4. The method as claimed in claim 1 wherein inscribing the fiducial mark in the mold cap includes forming a recessed shape by a laser marking device.

5. The method as claimed in claim 1 further comprising coupling discrete components to the substrate and under the mold cap.

6. A method of manufacture of an integrated circuit packaging system comprising:
  providing a substrate, having a component side;
  forming a mold cap, on the component side of the substrate;
  inscribing a fiducial mark in the mold cap;
  positioning a thermal interface material referenced by the fiducial mark including applying a measured shape; and
  mounting a heat spreader, on the thermal interface material, precisely positioned by aligning a position notch relative to the fiducial mark including compressing the measured shape between the heat spreader and the mold cap, the heat spreader having a bottom surface above a to surface of the mold cap and a portion of thermal interface material exposed from the heat spreader and the mold cap.

7. The method as claimed in claim 6 further comprising mounting a flip chip integrated circuit, having a flip chip back-side, on the substrate including reflowing chip interconnects between the flip chip integrated circuit and the substrate; and
  wherein:
    forming the mold cap includes forming the mold cap, on the flip chip integrated circuit and around the chip interconnects, to be coplanar with the flip chip back-side.

8. The method as claimed in claim 6 wherein positioning the thermal interface material referenced by the fiducial mark includes forming a measured pattern on a flip chip back-side surrounded by the mold cap.

9. The method as claimed in claim 6 wherein inscribing the fiducial mark in the mold cap includes forming a recessed shape by a laser marking device or a mask having patterned openings.

10. The method as claimed in claim 6 further comprising coupling discrete components on the substrate and under the mold cap including reflowing a connective solder between the discrete components and a signal coupling path within the substrate.

11. An integrated circuit packaging system comprising:
  a substrate;
  a mold cap formed on the substrate;
  a fiducial mark inscribed in the mold cap;
  a thermal interface material applied over the substrate and referenced by the fiducial mark; and
  a heat spreader, mounted on the thermal interface material, precisely positioned by a position notch aligned relative to the fiducial mark, the heat spreader having a bottom surface above a top surface of the mold cap and a portion of thermal interface material exposed from the heat spreader and the mold cap.

12. The system as claimed in claim 11 further comprising mounting a flip chip integrated circuit, having a flip chip back-side, on the substrate; and
  wherein:
    the mold cap formed on the substrate, includes the mold cap on the flip chip integrated circuit, to be coplanar with the flip chip back-side.

13. The system as claimed in claim 11 wherein the thermal interface material applied over the substrate and referenced by three of the fiducial mark includes a measured pattern precisely positioned between the fiducial mark.

14. The system as claimed in claim 11 wherein the fiducial mark inscribed in the mold cap includes a recessed shape formed by a laser marking device.

15. The system as claimed in claim 11 further comprising discrete components coupled to the substrate and under the mold cap.

16. The system as claimed in claim 11 further comprising:
  a component side of the substrate includes the mold cap formed thereon; and
  a measured shape of the thermal interface material applied in a position referenced by the fiducial mark includes the measured shape compressed between the heat spreader and the mold cap.

17. The system as claimed in claim 16 further comprising a flip chip integrated circuit, having a flip chip back-side, mounted on the substrate includes chip interconnects between the flip chip integrated circuit and the substrate; and
  wherein:
    the mold cap formed on the substrate includes the mold cap formed, on the flip chip integrated circuit and around the chip interconnects, to be coplanar with the flip chip back-side.

18. The system as claimed in claim 16 wherein the thermal interface material applied over the substrate and referenced by the fiducial mark includes a measured pattern, precisely positioned between three of the fiducial mark, on a flip chip back-side surrounded by the mold cap.

19. The system as claimed in claim 16 wherein the fiducial mark inscribed in the mold cap includes a recessed shape formed by a laser marking device or etched with or a mask having patterned openings.

20. The system as claimed in claim 16 further comprising discrete components coupled to the substrate and under the mold cap includes a connective solder between the discrete components and a signal coupling path within the substrate.

* * * * *